United States Patent
Chen et al.

(10) Patent No.: US 10,742,226 B1
(45) Date of Patent: Aug. 11, 2020

(54) MULTI-CHANNEL HIGH-PRECISION ADC CIRCUIT WITH SELF-CALIBRATION OF MISMATCH ERROR

(71) Applicants: Zhenhai Chen, Jiangsu (CN); Jinghe Wei, Jiangsu (CN); Ningye He, Jiangsu (CN); Yan Xue, Jiangsu (CN); Zongguang Yu, Jiangsu (CN); Jianghua Gui, Jiangsu (CN); Yu Zhou, Jiangsu (CN)

(72) Inventors: Zhenhai Chen, Jiangsu (CN); Jinghe Wei, Jiangsu (CN); Ningye He, Jiangsu (CN); Yan Xue, Jiangsu (CN); Zongguang Yu, Jiangsu (CN); Jianghua Gui, Jiangsu (CN); Yu Zhou, Jiangsu (CN)

(73) Assignee: The 58th Research Institute of China Electronics Technology Group Corporation, Wuxi, Jiangsu (CN)

( * ) Notice: Subject to any disclaimer, the term of this patent is extended or adjusted under 35 U.S.C. 154(b) by 0 days.

(21) Appl. No.: 16/442,585

(22) Filed: Jun. 17, 2019

(51) Int. Cl.
*H03M 1/10* (2006.01)
*H03M 1/38* (2006.01)
*H03M 1/12* (2006.01)

(52) U.S. Cl.
CPC ......... *H03M 1/1038* (2013.01); *H03M 1/124* (2013.01); *H03M 1/38* (2013.01)

(58) Field of Classification Search
CPC .. H03M 1/1215; H03M 1/121; H03M 1/1245; H03M 3/468; H03M 1/1009; H03M 1/662; H03M 1/1019; H03M 1/1205; H03M 1/128; H03M 1/462; H03M 1/10; H03M 1/1225

USPC ................... 341/118–121, 140, 141
See application file for complete search history.

(56) References Cited

U.S. PATENT DOCUMENTS

| | | | | |
|---|---|---|---|---|
| 7,084,793 | B2 * | 8/2006 | Elbornsson | H03M 1/0624 341/118 |
| 7,106,236 | B2 * | 9/2006 | Asami | H03M 1/1033 341/120 |
| 7,283,074 | B2 * | 10/2007 | Sheng | H03M 1/1014 341/120 |
| 8,102,289 | B2 * | 1/2012 | Oshima | H03M 1/1028 341/119 |
| 8,502,712 | B2 * | 8/2013 | Waki | H03M 1/0626 341/118 |
| 8,749,410 | B1 * | 6/2014 | Van Der Goes | H03M 1/1057 341/118 |
| 9,030,341 | B2 * | 5/2015 | Tan | H03M 1/1052 341/118 |
| 9,112,521 | B2 * | 8/2015 | Dedic | H03M 1/125 |

(Continued)

*Primary Examiner* — Linh V Nguyen

(57) ABSTRACT

The invention discloses a multi-channel high-precision ADC circuit with self-calibration of mismatch error, belonging to the technical field of integrated circuit. The multi-channel high-precision ADC circuit with self-calibration of mismatch error comprises a gain error compensation circuit, a clock phase error compensation circuit, an N-bit analog-digital converter of M-channel, a gain error quantization circuit, a clock phase error quantization circuit and a control circuit. The multi-channel high-precision ADC circuit with self-calibration of mismatch error can automatically choose the calibration precision according to system precision and hardware overhead, and has the characteristic of low power consumption.

10 Claims, 8 Drawing Sheets

(56) References Cited

U.S. PATENT DOCUMENTS

| | | | |
|---|---|---|---|
| 2007/0171116 A1* | 7/2007 | Fuse | H03M 1/1038 341/161 |
| 2010/0253557 A1* | 10/2010 | Kidambi | H03M 1/0624 341/118 |
| 2011/0193732 A1* | 8/2011 | Sestok | H03M 1/1061 341/118 |
| 2013/0106632 A1* | 5/2013 | Petigny | H03M 1/1004 341/120 |

* cited by examiner

MULTI-CHANNEL HIGH-PRECISION ADC CIRCUIT WITH SELF-CALIBRATION OF MISMATCH ERROR

BACKGROUND OF THE INVENTION

1. Field if the Invention

The invention relates to the technical field of integrated circuit, and in particular, to a multi-channel high-precision ADC circuit with self-calibration of mismatch error.

2. Description of the Related Art

Pipelined ADCs (analog-digital converter) with a precision of 14 digits and a sampling rate greater than 100 MSPS have been the main choice for various IF sampling systems, and thus have been widely adopted in electronic applications such as multi-carrier wideband wireless communication and radar reception. In order to reduce costs and improve reliability, the demand for low power consumption and miniaturization of various electronic systems has become increasingly prominent, and the requirements of power consumption and area of the ADC circuit used are increasingly strict. In order to improve the integration of pipelined ADCs, a single-chip integrated multi-channel ADC circuit is usually adopted to reduce the space occupied by the design of PCB system. In order to achieve the multi-channel integration of pipelined ADC circuits, there are some special requirements for the single-channel pipelined ADC core circuits adopted: first, the core of the ADC must have the characteristics of low power and small area; otherwise, the power and reliability issues caused by the multi-channel integration will greatly limit the application of PCB system; second, as few output ports as possible must adopted for the core of the ADC; otherwise, the packaging problems caused by the integration and the wiring problems of the high-speed signal lines of the PCB system will be greatly limited.

In addition, when multi-channel ADCs are integrated on the same chip, synchronous clock and gain mismatch errors occur between multi-channel ADCs due to device parameter mismatch between different chip areas. Especially for high-speed and high-precision ADCs, the effects of clock and gain errors mismatch between ADCs in different channels can be significant, and this mismatch error has a greater impact on system performance such as radar and multi-channel wireless communication. Therefore, it is practical to design a circuit that can self-calibrate various mismatch errors between ADCs in multi-channels.

SUMMARY OF THE INVENTION

The objective of the invention is to provide a multi-channel high-precision ADC circuit with self-calibration of mismatch error, to solve the problem of clock and gain errors mismatch generated by high-precision ADCs in the prior art.

In order to solve the technical issues above, the invention provides a multi-channel high-precision ADC circuit with self-calibration of mismatch error, comprising a gain error compensation circuit, a clock phase error compensation circuit, an N-bit analog-digital converter of M-channel, a gain error quantization circuit, a clock phase error quantization circuit and a control circuit; the N-bit analog-digital converter of M-channel comprises an N-bit analog-digital converter 1, an N-bit analog-digital converter 2, . . . , an N-bit analog-digital converter M;

wherein the M reference voltage output ports Vrc 1, Vrc 2, . . . , Vrc M of the gain error compensation circuit are respectively connected to the reference voltage input port of the N-bit analog-digital converter 1, N-bit analog-digital converter 2, . . . , N-bit analog-digital converter M, and the M+1th reference voltage output port Vrinref of the gain error compensation circuit is connected to the reference voltage input port of the gain error quantization circuit; the M clock output ports CKc 1, CKc 2, . . . , CKc M of the clock phase error compensation circuit are respectively connected to the clock input port of the N-bit analog-digital converter 1, N-bit analog-digital converter 2, . . . , N-bit analog-digital converter M;

the digital quantization code output ports D 1, D 2, . . . , D M of the N-bit analog-digital converter 1, N-bit analog-digital converter 2, . . . , N-bit analog-digital converter M are respectively connected to the M digital quantization code input ports of the gain error quantization circuit, the calibration reference signal Vr_cal of the gain error quantization circuit is output to the analog signal input port of the N-bit analog-digital converter 1, N-bit analog-digital converter 2, . . . , N-bit analog-digital converter M, and the K-bit quantization code _G of the gain error quantization circuit is output to the K-bit quantization code _G input port of the control circuit;

the M+1 error clock output ports CKout 1, CKout 2, . . . , CKout M and CKinref of the clock phase error compensation circuit are connected to the M+1 clock input ports of the clock phase error quantization circuit, the K-bit quantization code _CK of the clock phase error quantization circuit is output to the K-bit quantization code _CK input port of the control circuit;

the M K-bit delay code output ports of the control circuit are respectively connected to the M K-bit delay code input ports of the clock phase error compensation circuit, the M CK_Ctrl control signal output ports of the control circuit are respectively connected to M CK_Ctrl control signal input ports of the clock phase error compensation circuit, and the K-bit selecting code _CK output port and the Ctrl_mode_CK output port of the control circuit are respectively connected to the K-bit selecting code _CK input port and the Ctrl_mode_CK input port of the clock phase error quantization circuit; the M K-bit compensation code output ports of the control circuit are respectively connected to the M K-bit compensation code input ports of the gain error compensation circuit, and the M G_Ctrl control signal output ports of the control circuit are respectively connected to the M G_Ctrl control signal input ports of the gain error compensation circuit; the K-bit global adjustment code output port of the control circuit is connected to the K-bit global adjustment code input port of the gain error compensation circuit, and the K-bit selecting code _G output port and the Ctrl_mode_G output port of the control circuit are respectively connected to the K-bit selecting code _G input port and the Ctrl_mode_G input port of the gain error quantization circuit;

N, M and K are arbitrary positive integers.

Alternatively, the multi-channel high-precision ADC circuit with self-calibration of mismatch error includes a calibration mode and a compensation mode, and the compensation mode is entered after the calibration mode is ended;

when the calibration mode is entered, the phase mismatch error calibration on the N-bit analog-digital converters of M-channel are firstly sequentially performed by the multi-channel high-precision ADC circuit with self-calibration of mismatch error, to generate M sets of K-bit delay codes; after the phase mismatch error calibration is completed, the gain mismatch error calibration on the N-bit analog-digital converters of M-channel are then sequentially performed by the multi-channel high-precision ADC circuit with self-calibration of mismatch error, to generate M sets of K-bit compensation codes;

when the compensation mode is entered, M sets of K-bit delay codes and M sets of K-bit compensation codes remain unchanged; the phase and gain mismatch error compensation for the N-bit digital-analog converter of M-channel are simultaneously performed by the multi-channel high-precision ADC circuit with self-calibration of mismatch error, and the gain error quantization circuit and the clock phase error quantization circuit are both turned off to reduce power consumption.

Alternatively, the clock phase error compensation circuit comprises: a clock receiving circuit, a clock duty-stabilizing circuit, a clock driving circuit, M delay circuits, M multi-phase clock generating circuits and M clock equivalent delay circuits; each delay circuit, each multi-phase clock generating circuit, and each clock equivalent delay circuit correspond one by one;

the clock receiving circuit, the clock duty-stabilizing circuit, and the clock driving circuit are sequentially connected, and the input clock passes through the clock receiving circuit and enters the input port of the clock driving circuit; the M output clocks CKin 1, CKin 2, ..., CKin M of the clock driving circuit are respectively output to the input ports of the M delay circuits, and the M+1th output clock CKinref of the clock driving circuit is output to the clock phase error quantization circuit; the control signal input ports of the M delay circuits are respectively connected to the M CK_Ctrl control signal output ports of the control circuit, the delay code input ports of the respective delay circuits are respectively connected to the M K-bit delay code output ports of the control circuit, and the clock output ports of the respective delay circuits are simultaneously connected to the clock input ports of the corresponding multi-phase clock generating circuit and the clock equivalent delay circuit; the multi-phase output clocks CKc 1, CKc 2, ..., CKc M of the respective multi-phase clock generating circuits respectively enter the N-bit analog-digital converter of M-channel; the clock output ports CKout 1, CKout 2, ..., CKout M of the respective clock equivalent delay circuits are respectively connected to the M clock input ports of the clock phase error quantization circuit.

Alternatively, the clock equivalent delay circuit comprises: a multi-phase clock circuit equivalent delay unit, a sample hold circuit equivalent delay unit, a multi-sub-stage circuit equivalent delay unit, and a digital calibration circuit equivalent delay unit; the multi-sub-stage circuit equivalent delay unit comprises a first sub-stage circuit equivalent delay unit, a second sub-stage circuit equivalent delay unit, ..., an Rth sub-stage circuit equivalent delay unit;

the multi-phase clock circuit equivalent delay unit, the sample hold circuit equivalent delay unit, the first sub-stage circuit equivalent delay unit, the second sub-stage circuit equivalent delay unit, ..., the Rth sub-stage circuit equivalent delay unit and the digital calibration circuit equivalent delay unit are sequentially connected; the clock output port of the delay circuit is connected to the clock input port of the corresponding multi-phase clock circuit equivalent delay unit, and sequentially passes through the multi-phase clock circuit equivalent delay unit, the sample hold circuit equivalent delay unit, the first sub-stage circuit equivalent delay unit, the second sub-stage circuit equivalent delay unit, ..., the Rth sub-stage circuit equivalent delay unit, and the digital calibration circuit equivalent delay unit, then the clock is output;

when the clock equivalent delay circuit enters the compensation mode, the multi-phase clock circuit equivalent delay unit, the sample hold circuit equivalent delay unit, the multi-sub-stage circuit equivalent delay unit and the digital calibration circuit equivalent delay unit are turned off;

R is a positive integer.

Alternatively, the clock phase error quantization circuit comprises: a reference clock generating circuit, a phase detector, a loop filter, and a K-bit analog-digital converter circuit;

the M+1 clock input ports of the phase detector are respectively connected to the M clock output ports CKout 1, CKout 2, ..., CKout M and the clock output port CKref of the reference clock generating circuit; the control input port of the reference clock generating circuit is connected to the K-bit selecting code _CK output port of the control circuit; the phase error signal output port Vp of the phase detector is connected to the input port of the loop filter; the output voltage Vi of the loop filter is input to the voltage input port of the K-bit analog-digital converter; the K-bit quantization code _CK generated by the K-bit analog-digital converter is output to the K-bit quantization code _CK input port of the control circuit; the calibration control signal Ctrl_mode_CK output port of the control circuit is simultaneously connected to the calibration control signal input port of the phase detector, the loop filter and the K-bit analog-digital converter.

Alternatively, the gain error compensation circuit comprises: a reference voltage generating circuit, a reference voltage remote driving circuit, and M reference voltage adjusting circuits;

the reference voltage generating circuit outputs a reference voltage to the reference voltage remote driving circuit; the M reference voltage output ports of the reference voltage remote driving circuit are respectively connected to the reference voltage input ports of the M reference voltage adjusting circuits, and the M+1th reference voltage output port Vrinref is connected to the reference voltage input port of the gain error quantization circuit; the control signal input ports of the respective reference voltage adjusting circuits are respectively connected to the M G_Ctrl control signal output ports of the control circuit, the compensation code input ports of the respective reference voltage adjusting circuits are respectively connected to the M K-bit compensation code output ports of the control circuit, and the reference voltage output ports Vrc 1, Vrc 2, ..., Vrc M of the respective reference voltage adjusting circuits are respectively output to the N-bit analog-digital converter of M-channel.

Alternatively, the gain error quantization circuit comprises a calibration reference signal generating circuit and an N-bit digital subtraction circuit; the digital quantization code output ports D 1, D 2, ..., D M of the N-bit analog-digital converter of M-channel are respectively connected to the M sets of the digital code input ports of the N-bit digital subtraction circuit, and the M+1th set of the digital code input port of the N-bit digital subtraction circuit is connected to the output quantization code output port Dref of the calibration reference signal generating circuit; the control input port of the calibration reference signal generating circuit is connected to the K-bit selecting code _G output port of the control circuit; the K-bit quantization code _G output port of the N-bit digital subtraction circuit is connected to the K-bit quantization code _G input port of the control circuit; the calibration control signal Ctrl_mode_G output port of the control circuit is connected to the calibration control signal input port of the N-bit digital subtraction circuit and the calibration reference signal generating circuit.

Alternatively, the control circuit comprises: a core control circuit, a selecting code generating circuit, an adjustment code generating circuit, an operation circuit, a K-bit register set _G, a K-bit register set _CK, compensation code output register 1-compensation code output register M, delay code output register 1-delay code output register M, and a channel selecting circuit;

the input port of the core control circuit is connected to a calibration-start signal; the first output port of the core control circuit is connected to the control input port of the channel selecting circuit, the second output port thereof is connected to the control input port of the operation circuit, the third output port thereof is connected to the control input port of the selecting code generating circuit, the forth output port thereof is connected to the control input port of the adjustment code generating circuit, the fifth output port thereof is connected to the control input port of the K-bit register set _CK, the sixth output port thereof is connected to the control input port of the K-bit register set _G, the seventh output port to the M+6th output port thereof generate M calibration control signals G_Ctrl 1-G_Ctrl M, and the M+7th output port to the (2*M+6)th output port thereof generate M calibration control signals CK_Ctrl 1-CK_Ctrl M; the data input port of the operation circuit receives the data sent by the K-bit register set _CK output port and the K-bit register set _G output port, and the K-bit error code is generated according to the control instruction of the core control circuit; the K-bit error code is simultaneously sent to the data input port of the compensation code output register 1-the compensation code output register M and the delay code output register 1-the delay code output register M; the control signal input ports of the compensation code output register 1-the compensation code output register M are respectively connected to the M calibration control signals G_Ctrl1-G_Ctrl M, and the control signal input ports of the delay code output register 1-the delay code output register M are respectively connected to the M calibration control signals CK_Ctrl1-CK_Ctrl M; the output ports of the compensation code output register 1-the compensation code output register M are respectively connected to the first to the Mth data input ports of the channel selecting circuit, and the output ports of the delay code output register 1-the delay code output register M are respectively connected to the M+1th to the 2*Mth data input ports of the channel selecting circuit; the channel selecting circuit outputs a K-bit compensation code or a K-bit delay code according to the control instruction of the core control circuit; the selecting code generating circuit generates a K-bit selecting code according to the control instruction of the core control circuit; the adjustment code generating circuit generates a K-bit global adjustment code according to the control instruction of the core control circuit; the data input port of the K-bit register set _CK receives the K-bit quantization code _CK sent by the clock phase error quantization circuit, and transmits the data stored in the internal register thereof to the operation circuit according to the control instruction of the core control circuit; the data input port of the K-bit register set _G receives the K-bit quantization code _G sent by the gain error quantization circuit, and transmits the data stored in the internal register thereof to the operation circuit according to the control instruction of the core control circuit.

Alternatively, when the gain mismatch error calibration on the N-bit analog-digital converter of M-channel is performed, the output of the compensation code output register corresponding to the N-bit analog-digital converter that performs the gain mismatch error calibration is turned on by the channel selecting circuit, and the output of the remaining compensation code output registers are turned off; when the clock phase mismatch error calibration on the N-bit analog-digital converter of M-channel is performed, the output of the delay code output register corresponding to the N-bit analog-digital converter that performs the clock phase mismatch error calibration is turned on by the channel selecting circuit, and the output of the remaining delay code output registers are turned off.

Alternatively, when a K-bit error code is generated with the binary successive approximation algorithm by the operation circuit, only one bit of the K-bit error code is changed for each operation.

The invention provides a multi-channel high-precision ADC circuit with self-calibration of mismatch error, comprising a gain error compensation circuit, a clock phase error compensation circuit, an N-bit analog-digital converter of M-channel, a gain error quantization circuit, a clock phase error quantization circuit and a control circuit. The multi-channel high-precision ADC circuit with self-calibration of mismatch error can automatically choose the calibration precision according to system precision and hardware overhead, and has the characteristic of low power consumption.

DETAILED DESCRIPTION OF THE PREFERRED EMBODIMENTS

The multi-channel high-precision ADC circuit with self-calibration of mismatch error provided by the invention is further described hereinafter with reference to the drawings and specific embodiments. Advantages and features of the invention will be more apparent from the description and the appended claims. It should be noted that the drawings are in a very simplified form and with non-precise ratio, and are merely for convenience and clarity of the embodiments of the invention.

Embodiment 1

Figure 1:
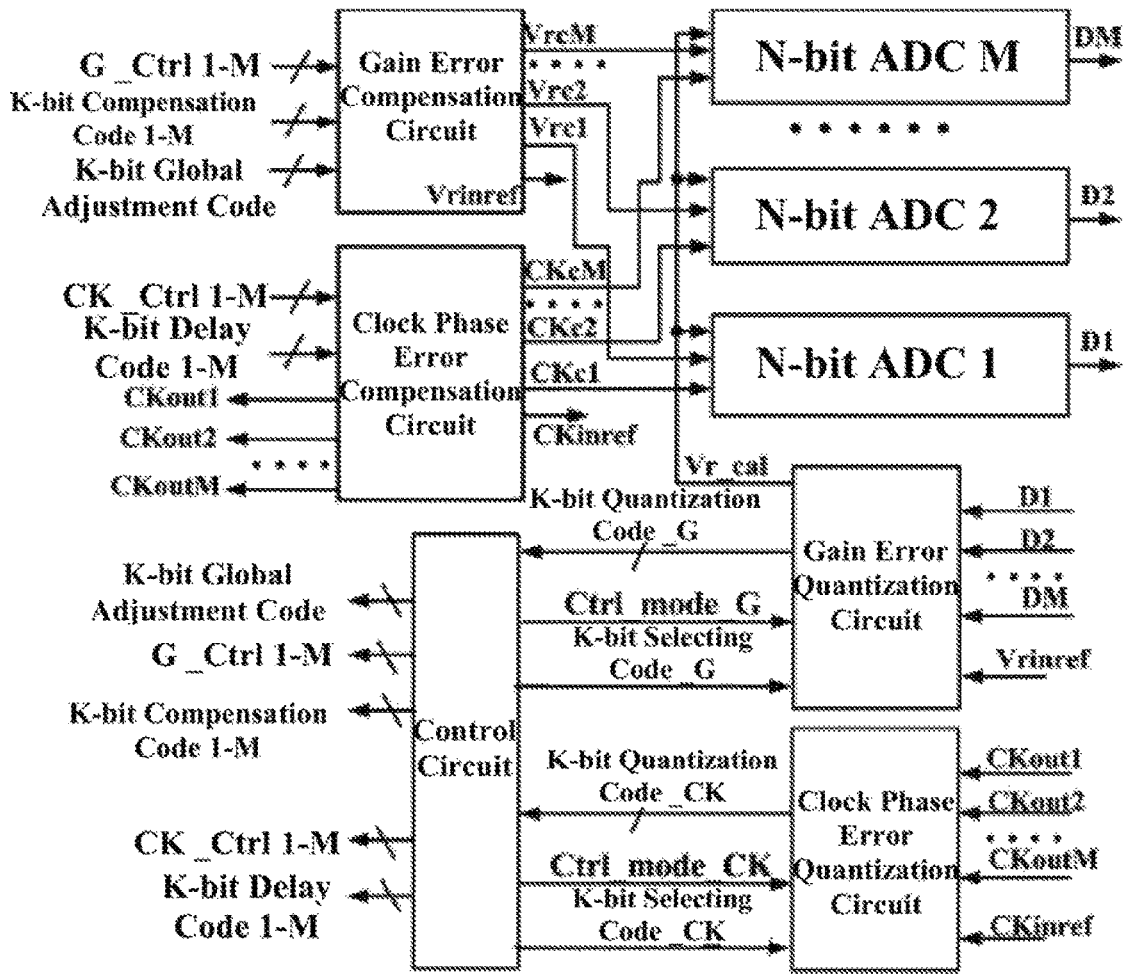
FIG. 1 is a schematic view illustrating the structure of the multi-channel high-precision ADC circuit with self-calibration of mismatch error.

The invention provides a multi-channel high-precision ADC circuit with self-calibration of mismatch error, as shown in FIG. 1. The multi-channel high-precision ADC circuit with self-calibration of mismatch error comprises a gain error compensation circuit, a clock phase error compensation circuit, an N-bit analog-digital converter of M-channel, a gain error quantization circuit, a clock phase error quantization circuit and a control circuit. The N-bit analog-digital converter of M-channel comprises an N-bit analog-digital converter 1, an N-bit analog-digital converter 2, . . . , an N-bit analog-digital converter M.

The M reference voltage output ports Vrc 1, Vrc 2, . . . , Vrc M of the gain error compensation circuit are respectively connected to the reference voltage input port of the N-bit analog-digital converter 1, N-bit analog-digital converter 2, . . . , N-bit analog-digital converter M; in addition, the M+1th reference voltage output port Vrinref of the gain error compensation circuit is connected to the reference voltage input port of the gain error quantization circuit; the M clock output ports CKc 1, CKc 2, . . . , CKc M of the clock phase error compensation circuit are respectively connected to the clock input port of the N-bit analog-digital converter 1, N-bit analog-digital converter 2, . . . , N-bit analog-digital converter M. The digital quantization code output ports D 1, D 2, . . . , D M of the N-bit analog-digital converter 1, N-bit analog-digital converter 2, . . . , N-bit analog-digital converter M are respectively connected to the M digital quantization code input ports of the gain error quantization circuit, the calibration reference signal Vr_cal of the gain error quantization circuit is output to the analog signal input port of the N-bit analog-digital converter 1, N-bit analog-digital converter 2, . . . , N-bit analog-digital converter M, and the K-bit quantization code _G of the gain error quantization circuit is output to the K-bit quantization code _G input port of the control circuit. The M+1 error clock output ports CKout 1, CKout 2, . . . , CKout M and CKinref of the clock phase error compensation circuit are connected to the M+1 clock input ports of the clock phase error quantization circuit, the K-bit quantization code _CK of the clock phase error quantization circuit is output to the K-bit quantization code _CK input port of the control circuit. The M K-bit delay code output ports 1-M of the control circuit are respectively connected to the M K-bit delay code input ports 1-M of the clock phase error compensation circuit, the M CK_Ctrl control signal output ports CK_Ctrl 1-M of the control circuit are respectively connected to M CK_Ctrl control signal input ports CK_Ctrl 1-M of the clock phase error compensation circuit, and the K-bit selecting code _ CK output port and the Ctrl_mode_CK output port of the control circuit are respectively connected to the K-bit selecting code _CK input port and the Ctrl_mode_CK input port of the clock phase error quantization circuit; the M K-bit compensation code output ports 1-M of the control circuit are respectively connected to the M K-bit compensation code input ports 1-M of the gain error compensation circuit, and the M G_Ctrl control signal output ports G_Ctrl 1-M of the control circuit are respectively connected to the M G_Ctrl control signal input ports G_Ctrl 1-M of the gain error compensation circuit; the K-bit global adjustment code output port of the control circuit is connected to the K-bit global adjustment code input port of the gain error compensation circuit, and the K-bit selecting code _G output port and the Ctrl_mode_G output port of the control circuit are respectively connected to the K-bit selecting code _G input port and the Ctrl_mode_G input port of the gain error quantization circuit. N, M and K are arbitrary positive integers.

Specifically, the multi-channel high-precision ADC circuit with self-calibration of mismatch error includes a calibration mode and a compensation mode, and the compensation mode is entered after the calibration mode is ended. when the calibration mode is entered, the phase mismatch error calibration on the N-bit analog-digital converters of M-channel are firstly sequentially performed by the multi-channel high-precision ADC circuit with self-calibration of mismatch error, to generate M sets of K-bit delay codes; after the phase mismatch error calibration is completed, the gain mismatch error calibration on the N-bit analog-digital converters of M-channel are then sequentially performed by the multi-channel high-precision ADC circuit with self-calibration of mismatch error, to generate M sets of K-bit compensation codes; when the compensation mode is entered, M sets of K-bit delay codes and M sets of K-bit compensation codes remain unchanged; the phase and gain mismatch error compensation for the N-bit digital-analog converter of M-channel are simultaneously performed by the multi-channel high-precision ADC circuit with self-calibration of mismatch error, and the gain error quantization circuit and the clock phase error quantization circuit are both turned off to reduce power consumption.

The operating principle of the above multi-channel high-precision ADC circuit with self-calibration function of mismatch error is as follows: when the calibration mode is entered, the control circuit first controls the clock phase error quantization circuit to enter the calibration mode by the Ctrl_mode_CK signal, and the K-bit selecting code _CK is simultaneously output to the clock phase error quantization circuit; the phase mismatch error calibration on the N-bit analog-digital converter of M-channel is performed by the multi-channel high-precision ADC circuit with self-calibration of mismatch error; the control circuit then outputs a first calibration control signal CK_Ctrl 1 to the clock phase error compensation circuit, and the phase mismatch error calibration of the N-bit analog-digital converter circuit 1 is performed.

Figure 2:
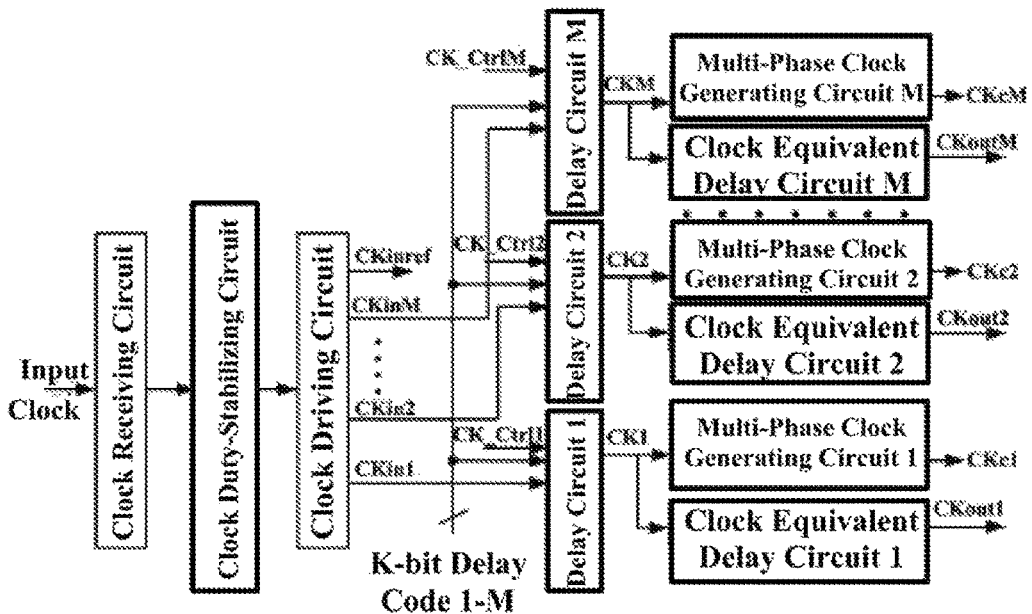
FIG. 2 is a schematic view illustrating the structure of the clock phase error compensation circuit.

Specifically, FIG. 2 is a schematic view illustrating the structure of the clock phase error compensation circuit. The clock phase error compensation circuit comprises: a clock receiving circuit, a clock duty-stabilizing circuit, a clock driving circuit, M delay circuits, M multi-phase clock generating circuits and M clock equivalent delay circuits; each delay circuit, each multi-phase clock generating circuit, and each clock equivalent delay circuit correspond one by one; the delay circuit 1, the multi-phase clock generating circuit 1 and the clock equivalent delay circuit 1 are in correspondence, the delay circuit 2, the multi-phase clock generating circuit 2 and the clock equivalent delay circuit 2 are in correspondence, . . . , the delay circuit M, the multi-phase clock generating circuit M and the clock equivalent delay circuit M are in correspondence. The clock receiving circuit, the clock duty-stabilizing circuit, and the clock driving circuit are sequentially connected, and the input clock passes through the clock receiving circuit and enters the input port of the clock driving circuit; the M output clocks CKin 1, CKin 2, . . . , CKin M of the clock driving circuit are respectively connected to the input ports of the M delay circuits: the output clock CKin 1 is connected to the input port of the delay circuit 1, the output clock CKin 2 is connected to the input port of the delay circuit 2, . . . , the output clock CKin M is connected to the input port of the delay circuit M. The M+1th output clock CKinref of the clock driving circuit is output to the clock phase error quantization circuit. The control signal input ports of the respective delay circuits are respectively connected to the control signals CK_Ctrl 1-M outputted by the output port of the control circuit control signal: the control signal input port of the delay circuit 1 is connected to the control signal CK_Ctrl 1, the control signal input port of the delay circuit 2 is connected to the control signal CK_Ctrl 2, . . . , the control signal input port of the delay circuit M is connected to the control signal CK_Ctrl M. The delay code input ports of the respective delay circuits are respectively connected to the K-bit delay codes 1-M outputted by the output port of the control circuit delay code: the delay code input port of the delay circuit 1 is connected to the K-bit delay code 1, the delay code input port of the delay circuit 2 is connected to the K-bit delay code 2, . . . , the delay code input port of the delay circuit M is connected to the K-bit delay code M. The clock output ports of the respective delay circuits are simultaneously connected to the clock input ports of the corresponding multi-phase clock generating circuit and clock equivalent delay circuit: the clock output port of the delay circuit 1 is simultaneously connected to the multi-phase clock generating circuit 1 and the clock equivalent delay circuit 1, the clock output port of the delay circuit 2 is simultaneously connected to the multi-phase clock generating circuit 1 and the clock equivalent delay circuit 2, . . . , the clock output port of the delay circuit M is simultaneously connected to the multi-phase clock generating circuit 1 and the clock equivalent delay circuit M. The multi-phase output clocks CKc 1, CKc 2, . . . , CKc M of the respective multi-phase clock generating circuits respectively enter the N-bit analog-digital converter of M-channel: the multi-phase output clock CKc 1 enters the N-bit analog-digital converter 1, the multi-phase output clock CKc 2 enters the N-bit analog-digital converter 2, . . . , the multi-phase output clock CKc M enters the N-bit analog-digital converter M. The clock output ports CKout 1, CKout 2, . . . , CKout M of the respective clock equivalent delay circuits are respectively connected to the M clock input ports of the clock phase error quantization circuit.

Figure 3:
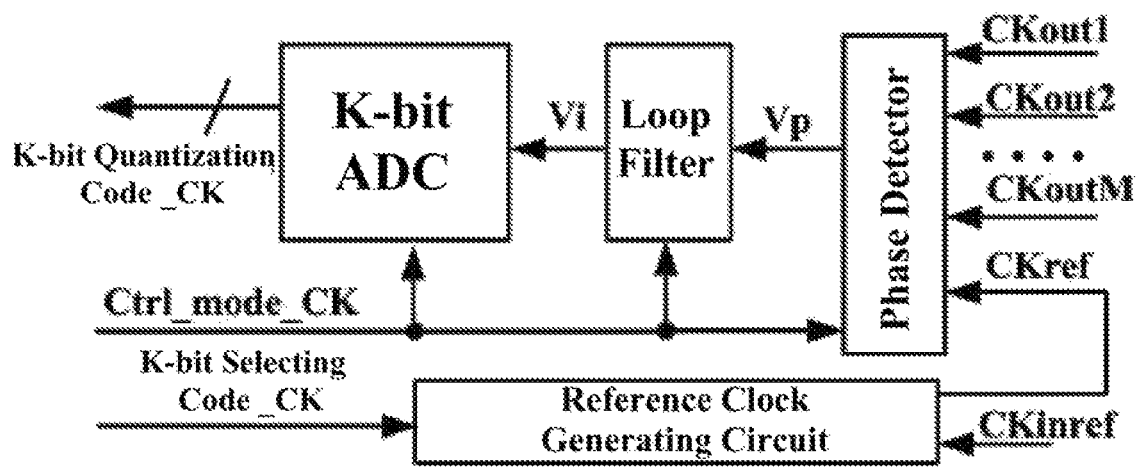
FIG. 3 is a schematic view illustrating the structure of the clock phase error quantization circuit.

FIG. 3 is a schematic view illustrating the structure of the clock phase error quantization circuit. The clock phase error quantization circuit comprises: a reference clock generating circuit, a phase detector, a loop filter, and a K-bit analog-digital converter circuit. the M+1 clock input ports of the phase detector are respectively connected to the M clock output ports CKout 1, CKout 2, . . . , CKout M and the clock output port CKref of the reference clock generating circuit; the control input port of the reference clock generating circuit is connected to the K-bit selecting code _CK output port of the control circuit; the phase error signal output port Vp of the phase detector is connected to the input port of the loop filter; the output voltage Vi of the loop filter is input to the voltage input port of the K-bit analog-digital converter; the K-bit quantization code _CK generated by the K-bit analog-digital converter is output to the K-bit quantization code _CK input port of the control circuit; the calibration control signal Ctrl_mode_CK output port of the control circuit is simultaneously connected to the calibration control signal input port of the phase detector, the loop filter and the K-bit analog-digital converter.

Figure 4:
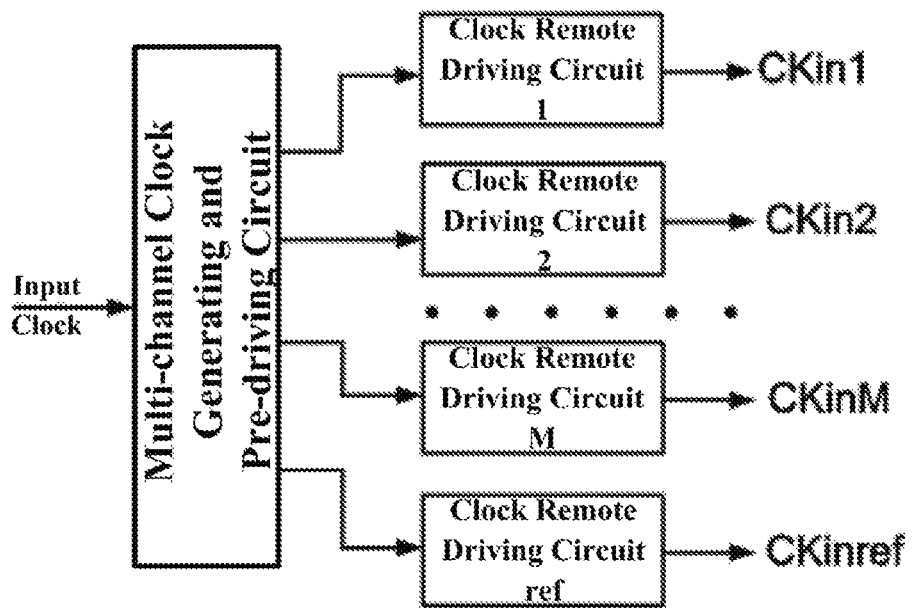
FIG. 4 is a schematic view illustrating the structure of the clock driving circuit.

FIG. 4 is an implementation of the clock driving circuit. The clock driving circuit comprises a multi-channel clock generating and pre-driving circuit and M+1 clock remote driving circuits; the M+1 clock remote driving circuits are respectively: clock remote driving circuit 1, clock remote driving circuit 2, . . . , clock remote driving circuit M and clock remote driving circuit ref. The clock duty-stabilizing circuit outputs the clock to the multi-channel clock generation and pre-driving circuit, generates M+1 clocks and obtains M+1 output clocks via the M+1 clock remote drive circuits. M clocks CKin 1, CKin 2, . . . , CKin M are respectively connected to M delay circuits: the clock CKin 1 is connected to the input port of the delay circuit 1, the clock CKin 2 is connected to the input port of the delay circuit 2, . . . , the clock CKin M is connected to the input port of the delay circuit M. The M+1th clock CKinref is output to the reference clock generating circuit. The multi-channel clock generation and pre-driving circuit can be implemented by RS flip-flop and inverter coupling. The clock remote drive circuit is implemented with an inverter driving chain.

The clock phase calibration circuit for multi-channel ADC can be used for simultaneous sampling ADC of M-channel as well as time-interleaved ADC of M-channel. When the invention is applied to a synchronous sampling ADC of M-channel, the M+1 clocks generated by the multi-channel clock generation and pre-driving circuits are clock signals of the same phase. When the invention is applied to a time-interleaved ADC of M-channel, the M clocks CKin 1-CKin M generated by the multi-channel clock generation and pre-driving circuits are clock signals of equal interval phase difference, and the phase difference is 360°/M; the M+1th clock CKinref is the same as one of the M clocks CKin 1 to CKin M. When the phase mismatch error calibration of the N-bit analog-digital converter circuit X is performed by the clock phase calibration circuit for multi-channel ADC, the phases of CKinref and CKin X are the same.

Figure 5:
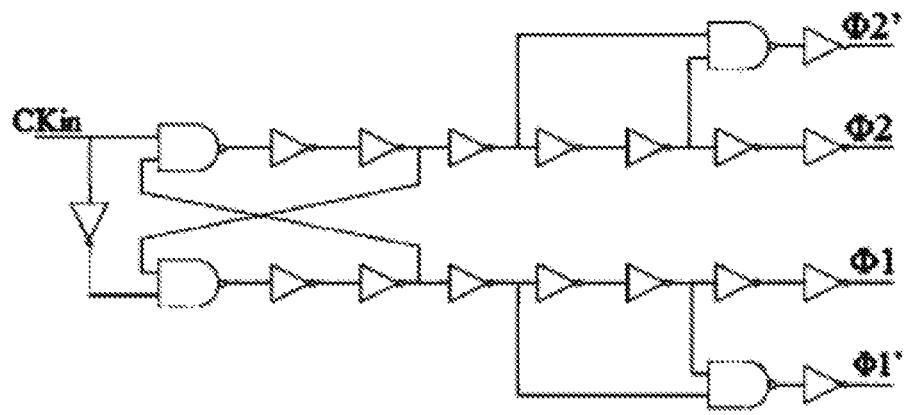
FIG. 5 is a schematic view illustrating the structure of the multi-phase clock generating circuit.

For pipelined ADCs, the sub-stage circuit thereof requires a two-phase clock to control the operation condition om order to complete the sampling and holding of the analog input signal. FIG. 5 is an implementation of the multi-phase clock generating circuit of the invention. CKin is the external input reference clock signal, and Φ1 and Φ2 are two-phase non-overlapping signals output by the circuit. At the same time, in pipelined modules, in order to eliminate the nonlinear effects such as the channel charge injection effect and the clock feedthrough effect of the switching transistor, an auxiliary clock signal needs to be added, and Φ 1' and Φ2' are auxiliary clock signals designed to eliminate the above nonlinearity. The clock circuit is generated by an RS flip-flop, and the non-overlapping interval is controlled by the delay of the two inverters. The auxiliary clock circuit is generated by the non-overlapping clock signal and the delay between the two inverters and the AND gate circuit, and the rising edge of the two clock signals can be aligned by the AND gate circuit, and the delay time of the auxiliary clock and the non-overlapping clock signal is determined by the delay of the inverter. When being introduced, the two auxiliary clocks Φ 1' and Φ2' are turned off before the respective original clock signals Φ1 and Φ2 are turned off. The multi-phase clock generation circuit shown in FIG. 5 can be used to generate a simple two-phase non-overlapping clock, and a four-phase non-overlapping clock can also be generated by extending the flip-flop and the feedback loop. However, in order to generate a clock with more phase complexity, a higher phase stability clock signal with higher stability is generated by the delay-locked loop (DLL).

Figure 6:
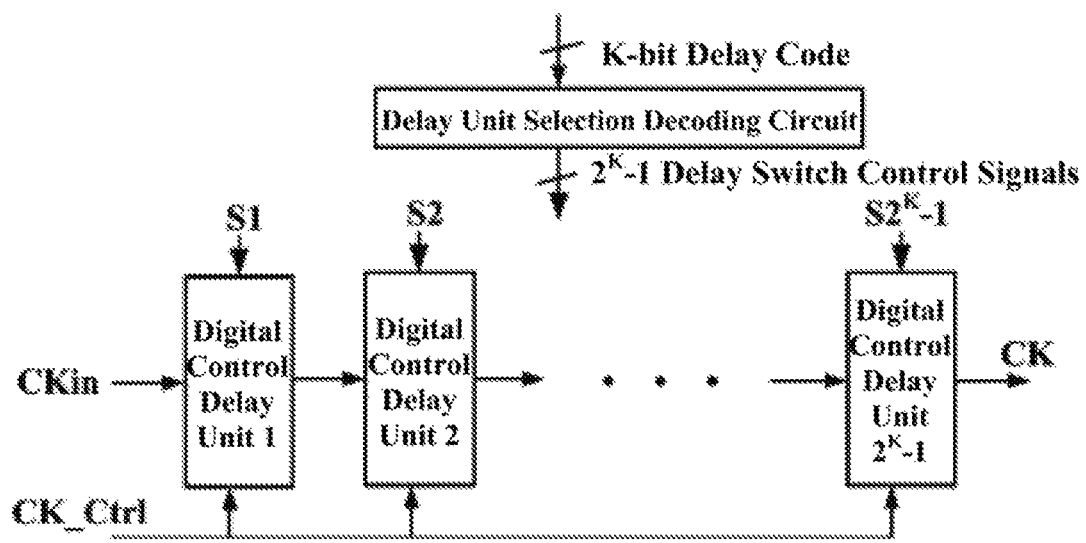
FIG. 6 is a schematic view illustrating the structure of the delay circuit.

FIG. 6 is a schematic view illustrating the structure of the delay circuit. The delay circuit comprises a delay unit selection decoding circuit and $2^K-1$ digital control delay units. The $2^K-1$ digital control delay units are respectively digital control delay unit 1, digital control delay unit 2, . . . , digital control delay unit $2^K-1$. The K-bit delay code input to the control circuit enters the delay unit selection decoding circuit to generate $2^K-1$ delay switch control signals: S1, S2, . . . , S$2^K-1$, and the $2^K-1$ delay switch control signals respectively control the delay time of the $2^K-1$ digital control delay units; CKin is connected to the clock input port of the digital control delay unit 1, the clock output port of the digital control delay unit 1 is connected to the clock input port of the digital control delay unit 2, . . . , the clock output of the digital control delay unit $2^K-1$ is CK. The delay of the $2^K-1$ digital control delay unit is controlled by the calibration control signal CK_Ctrl in addition to the control of the $2^K-1$ delay switch control signals. When the delay circuit enters the calibration mode, the delay of the $2^K-1$ digital control delay units is controlled by the $2^K-1$ delay switch control signals; when the delay circuit enters the compensation mode, the delay of the $2^K-1$ digital control delay units remains unchanged, and is not controlled by the $2^K-1$ delay switch control signals.

Figure 7:
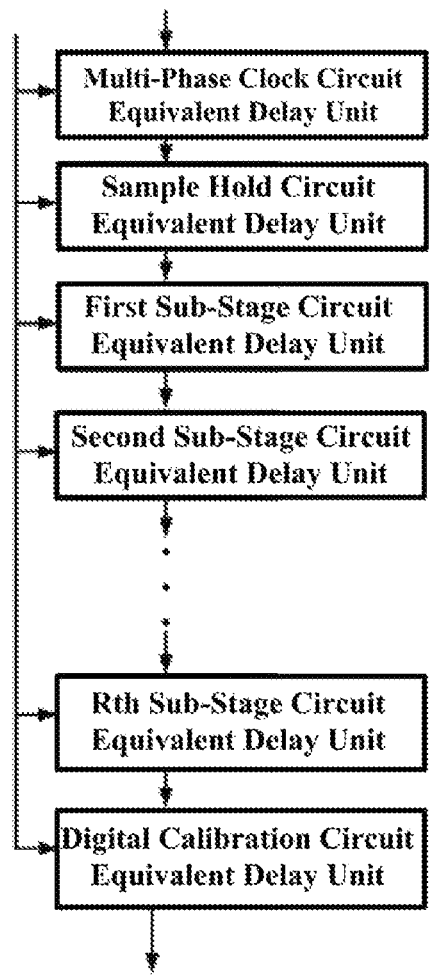
FIG. 7 is a schematic view illustrating the structure of the clock equivalent delay circuit.

Specifically, FIG. 7 is a schematic view illustrating the structure of the clock equivalent delay circuit. The clock equivalent delay circuit comprises: a multi-phase clock circuit equivalent delay unit, a sample hold circuit equivalent delay unit, a multi-sub-stage circuit equivalent delay unit, and a digital calibration circuit equivalent delay unit; the multi-sub-stage circuit equivalent delay unit comprises a first sub-stage circuit equivalent delay unit, a second sub-stage circuit equivalent delay unit, . . . , an Rth sub-stage circuit equivalent delay unit. The multi-phase clock circuit equivalent delay unit, the sample hold circuit equivalent delay unit, the first sub-stage circuit equivalent delay unit, the second sub-stage circuit equivalent delay unit, . . . , the Rth sub-stage circuit equivalent delay unit and the digital calibration circuit equivalent delay unit are sequentially connected; the clock output port of the delay circuit is connected to the clock input port of the corresponding multi-phase clock circuit equivalent delay unit, and sequentially passes through the multi-phase clock circuit equivalent delay unit, the sample hold circuit equivalent delay unit, the first sub-stage circuit equivalent delay unit, the second sub-stage circuit equivalent delay unit, . . . , the Rth sub-stage circuit equivalent delay unit, and the digital calibration circuit equivalent delay unit, then the clock is output. When the clock equivalent delay circuit enters the calibration mode, the multi-phase clock circuit equivalent delay unit, the sample hold circuit equivalent delay unit, the multi-sub-stage circuit equivalent delay unit and the digital calibration circuit equivalent delay unit operate normally; when the clock equivalent delay circuit enters the compensation mode, the multi-phase clock circuit equivalent delay unit, the sample hold circuit equivalent delay unit, the multi-sub-stage circuit equivalent delay unit and the digital calibration circuit equivalent delay unit are turned off; R is a positive integer.

Figure 8:
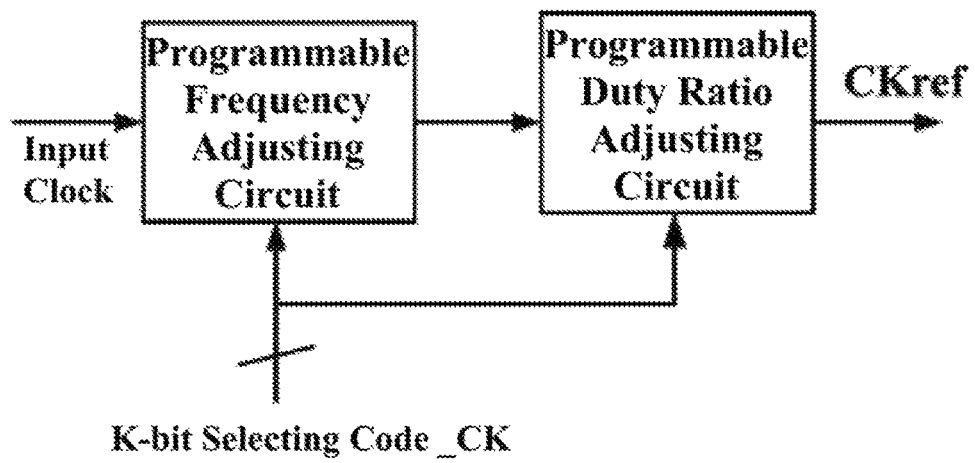
FIG. 8 is a schematic view illustrating the structure of the reference clock generating circuit.

FIG. 8 is a block diagram illustrating the structure of the reference clock generating circuit. The he reference clock generating circuit comprises: a programmable frequency adjusting circuit and a programmable duty ratio adjusting circuit. The programmable frequency adjusting circuit and the programmable duty ratio adjusting circuit are both controlled by the K-bit selecting selecting code _CK. Under the control of the K-selecting selecting code _CK, the input clock with fixed frequency and duty ratio passes through the programmable frequency adjusting circuit and the programmable duty ratio adjusting circuit, to obtain the reference clocks Ckref with different frequencies and duty ratios.

Figure 9:
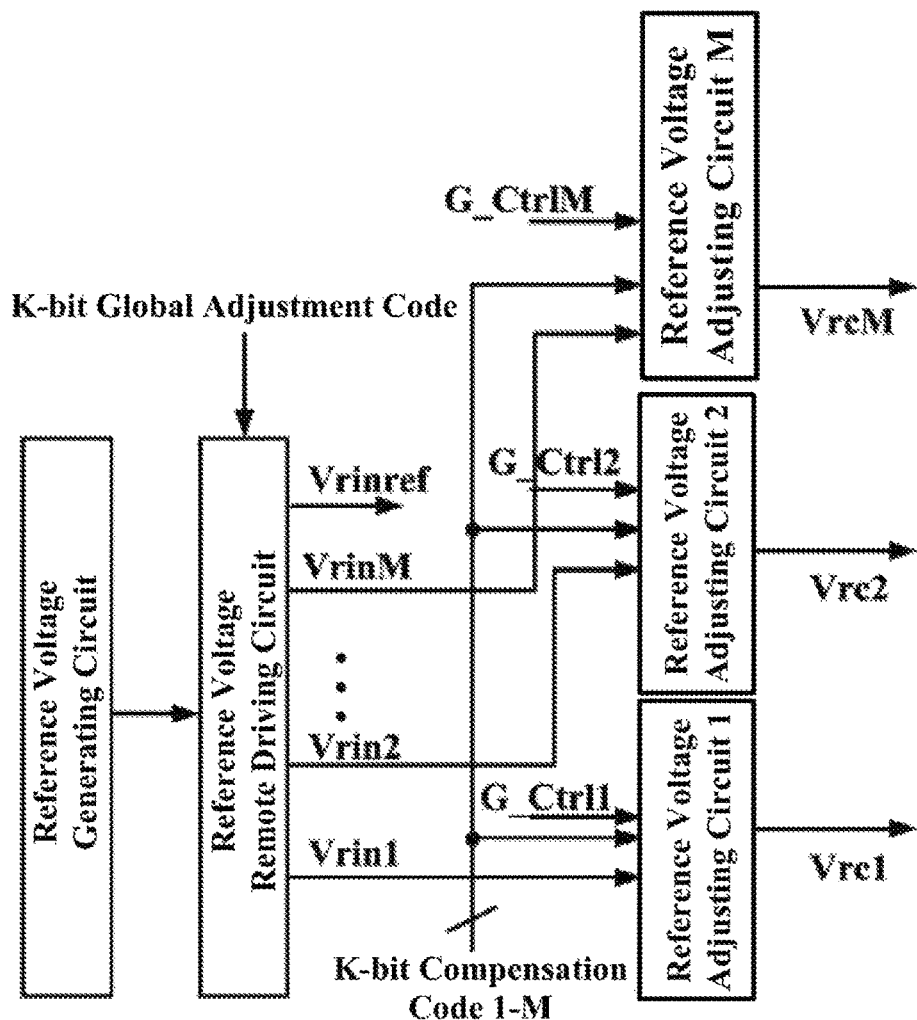
FIG. 9 is a schematic view illustrating the structure of the gain error compensation circuit.

The structure of the gain error compensation circuit is shown in FIG. 9. The gain error compensation circuit comprises: a reference voltage generating circuit, a reference voltage remote driving circuit, and M reference voltage adjusting circuits. The M reference voltage adjusting circuits are respectively reference voltage adjusting circuit 1, reference voltage adjusting circuit 2, . . . , reference voltage adjusting circuit M. The reference voltage generating circuit generates a reference voltage and outputs to the reference voltage remote driving circuit; the reference voltage remote driving circuit is controlled by the K-bit global adjustment code, and the M reference voltage output ports output M reference voltages Vrin 1, Vrin 2, . . . , Vrin M to the reference voltage input ports of the M reference voltage adjusting circuits respectively: the reference voltage Vrin 1 is output to the reference voltage adjusting circuit 1, the reference voltage Vrin 2 is output to the reference voltage adjusting circuit 2, . . . , the reference voltage Vrin M is output to the reference voltage adjusting circuit M. The M+1th reference voltage output port Vrinref outputs a reference voltage to the reference voltage input port of the gain error quantization circuit. The control signal input ports of the respective reference voltage adjusting circuits are respectively connected to the control signals G_Ctrl 1-M outputted by the output port of the control signal of the control circuit: the control signal input port of the reference voltage adjusting circuit 1 is connected to the control signal G_Ctrl 1, the control signal input port of the reference voltage adjusting circuit 2 is connected to the control signal G_Ctrl 2, . . . , the control signal input port of the reference voltage adjusting circuit M is connected to the control signal G_Ctrl M. The compensation code input ports of the respective reference voltage adjusting circuits are respectively connected to the K-bit compensation codes 1-M outputted by the control circuit compensation code output port: the compensation code input port of the reference voltage adjusting circuit 1 inputs the K-bit compensation code 1, the compensation code input port of the reference voltage adjusting circuit 2 inputs the K-bit compensation code 2, . . . , the compensation code input port of the reference voltage adjusting circuit M inputs the K-bit compensation code M. The reference voltage output ports Vrc 1, Vrc 2, . . . , Vrc M of the respective reference voltage adjusting circuits are respectively output to the N-bit analog-digital converter of M-channel: the reference voltage output port Vrc 1 of the reference voltage adjusting circuit 1 is connected to the N-bit analog-digital converter 1, the reference voltage output port Vrc 2 of the reference voltage adjusting circuit 1 is connected to the N-bit analog-digital converter 2, . . . , the reference voltage output port Vrc M of the reference voltage adjusting circuit 1 is connected to the N-bit analog-digital converter M.

Figure 10:
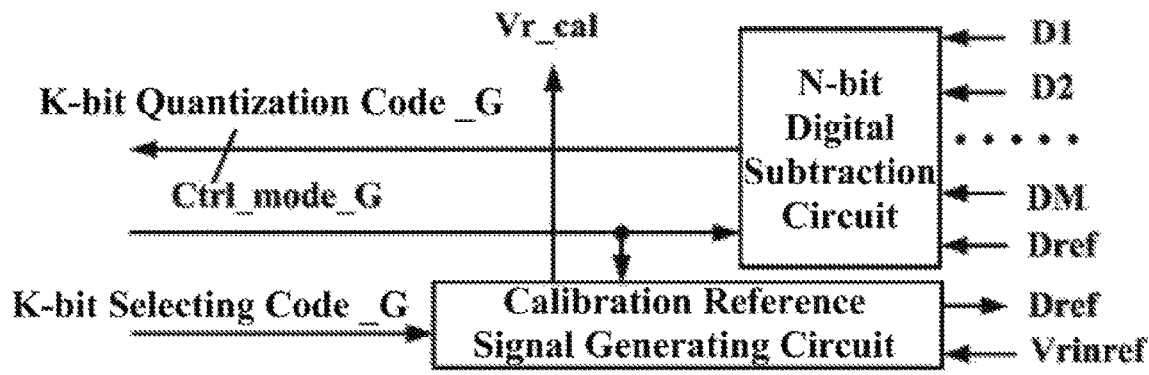
FIG. 10 is a schematic view illustrating the structure of the gain error quantization circuit.

FIG. 10 is a schematic view illustrating the structure of the gain error quantization circuit. The gain error quantization circuit comprises a calibration reference signal generating circuit and an N-bit digital subtraction circuit. The digital quantization code output ports D 1, D 2, . . . , D M of the N-bit analog-digital converter of M-channel are respectively connected to the M sets of the digital code input ports of the N-bit digital subtraction circuit, and the M+1th set of the digital code input port of the N-bit digital subtraction circuit is connected to the output quantization code output port Dref of the calibration reference signal generating circuit. The control input port of the calibration reference signal generating circuit is connected to the K-bit selecting code _G output port of the control circuit; the calibration reference signal Vr_cal generated by the calibration reference signal generating circuit is simultaneously connected to the analog signal input port of the N-bit analog-digital converter of M-channel. The K-bit quantization code _G output port of the N-bit digital subtraction circuit is connected to the K-bit quantization code _G input port of the control circuit; the calibration control signal Ctrl_mode_G output port of the control circuit is connected to the calibration control signal input port of the N-bit digital subtraction circuit and the calibration reference signal generating circuit.

Figure 11:
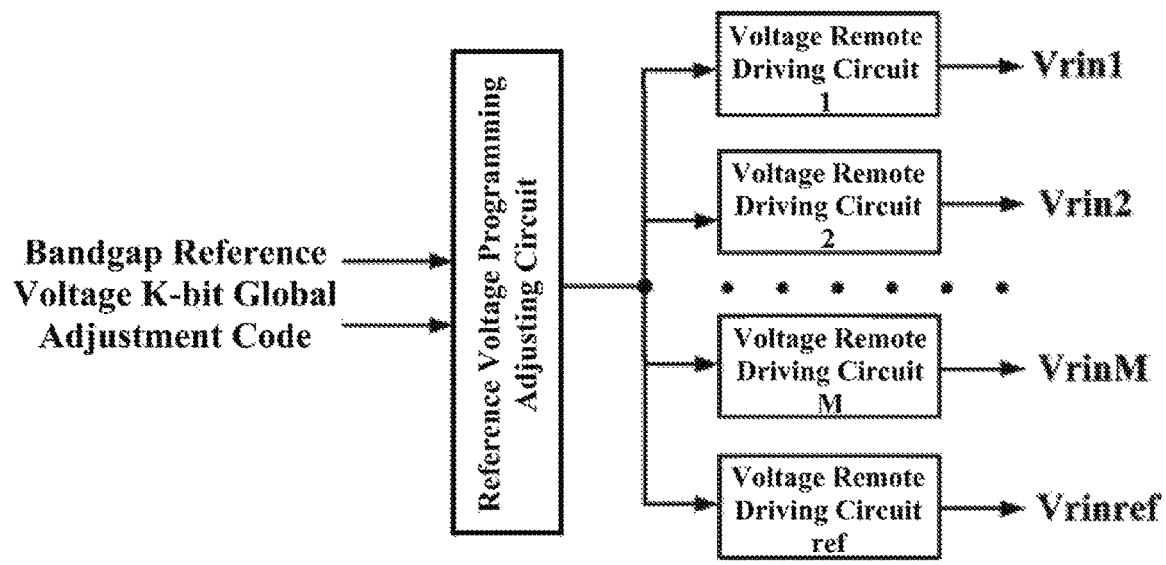
FIG. 11 is a schematic view illustrating the structure of the reference voltage remote driving circuit.
Figure 12:
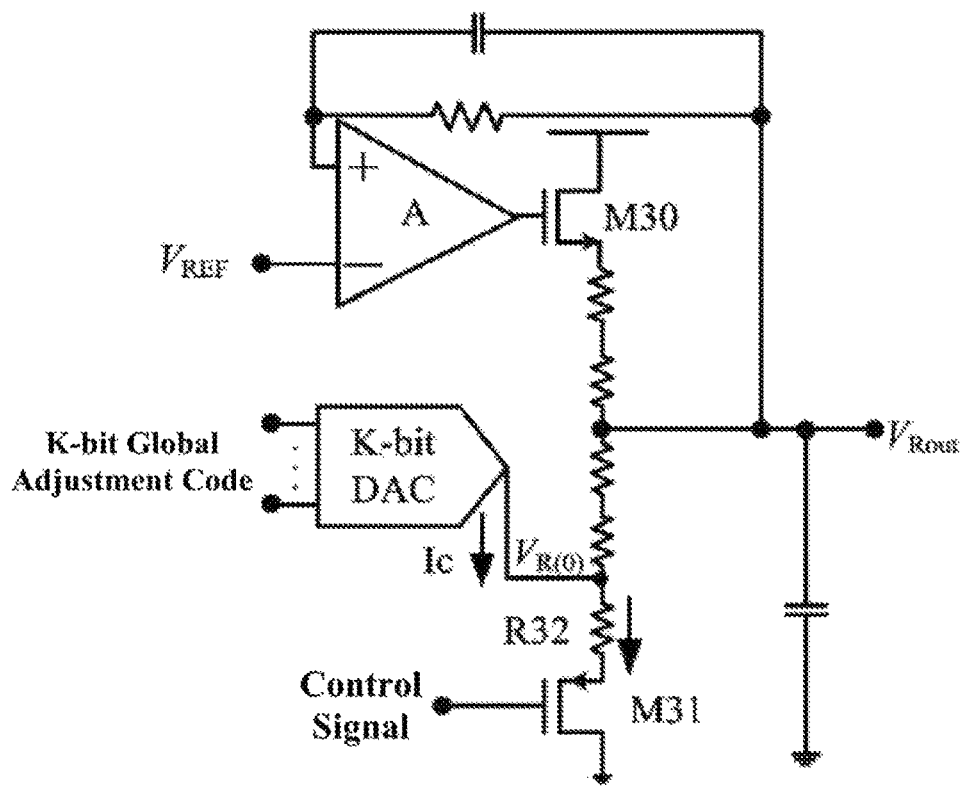
FIG. 12 is a schematic view illustrating the structure of the reference voltage programming adjusting circuit.

FIG. 11 is an implementation of the reference voltage remote driving circuit. The reference voltage remote driving circuit comprises a reference voltage programming adjusting circuit and M+1 voltage remote driving circuits. The M+1 voltage remote driving circuits are respectively voltage remote driving circuit 1, voltage remote driving circuit 2, ..., voltage remote driving circuit M and voltage remote driving circuit ref. The bandgap reference voltage enters the reference voltage programming adjusting circuit and is simultaneously output to the M+1 voltage remote driving circuits. The output voltage of the reference voltage programming adjusting circuit is controlled by the K-bit global adjustment code, and the control circuit adjusts the reference voltage used of all ADC channels by adjusting the K-bit global adjustment code. FIG. 12 is a specific implementation of the reference voltage programming adjusting circuit, which is structured as a digitally controlled LDO circuit. When the control signal is set to 0, the PMOS transistor M31 is conductive. Due to the negative feedback of the operational amplifier, the reference voltage V REF is divided by the resistor under the control of the adjustment NMOS transistor M30 to obtain an initial voltage output V R (0); meanwhile, the current-mode K-bit DAC also generates an adjustment current Ic to ground, and the adjustment current Ic flows through the end resistor R32 to ground, thus, a voltage of $\Delta V$ that is equal to Ic×R32 is superimposed on the resistor R32, and the voltage V Rout outputted to the reference signal output circuit is equal to V R (0)+$\Delta V$. According to the voltage-dividing of the resistor, the output reference voltage signal V Rout will change accordingly. Therefore, as long as the K-bit global adjustment code is controlled, the purpose of changing the output reference voltage can be achieved. All of the reference voltage adjusting circuits in the embodiment of the invention adopt the circuit configuration shown in FIG. 12. For the implementation of the M+1 voltage remote driving circuits, a voltage follower can be adopted.

Figure 13:
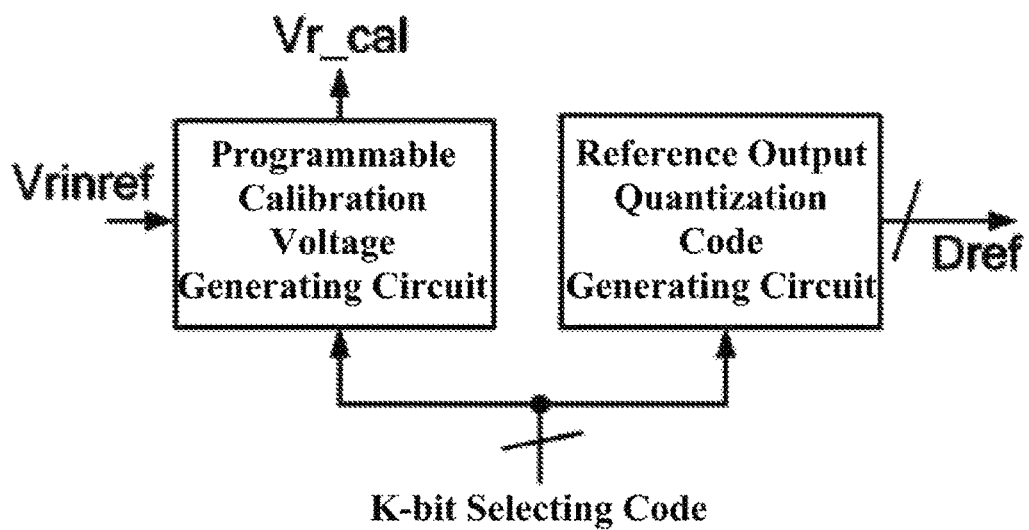
FIG. 13 is a schematic view illustrating the structure of the calibration reference signal generating circuit.
Figure 14:
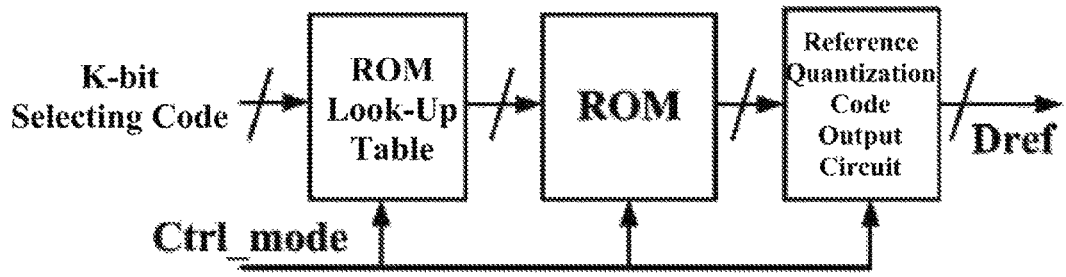
FIG. 14 is a schematic view illustrating the structure of the reference output quantization code generating circuit.

FIG. 13 is a block diagram illustrating the calibration reference signal generating circuit. The calibration reference signal generating circuit comprises: a programmable calibration voltage generating circuit and a reference output quantization code generating circuit. The reference voltage input port of the programmable calibration voltage generating circuit is connected to the reference voltage Vrinref output by the voltage remote driving circuit, and the programmable calibration voltage generating circuit outputs a calibration reference voltage Vr_cal under the control of the K-bit selecting code; the reference output quantization code generation circuit outputs the reference output quantization code Dref under the control of the K-bit selecting code. The programmable calibration voltage generating circuit can be realized by the circuit structure shown in FIG. 12. FIG. 14 is a block diagram illustrating the reference output quantization code generating circuit of the invention. The reference output quantization code generating circuit comprises: ROM look-up table, ROM and reference quantization code output circuit modules, all controlled by the Ctrl_mode signal. The reference output quantization code generating circuit operates only in the calibration mode. The K-bit selecting code is entered to enter the ROM look-up table, to obtain the corresponding address to the ROM module; the ROM module outputs the reference quantization code data stored in the corresponding address corresponding memory unit to the reference quantization code output circuit, and the reference quantization code output circuit drives the reference quantization code data Dref to be output.

Figure 15:
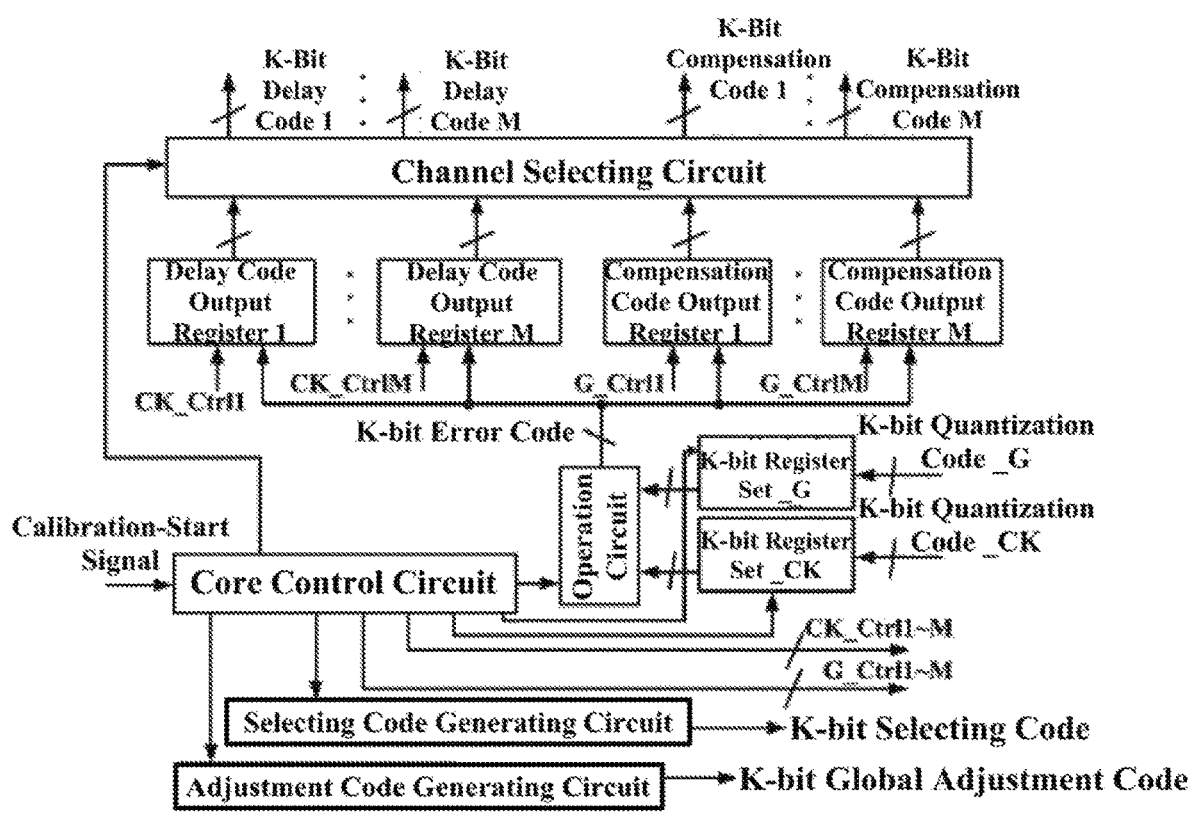
FIG. 15 is a schematic view illustrating the structure of the control circuit.

FIG. 15 is a block diagram illustrating the control circuit. The control circuit comprises: a core control circuit, a selecting code generating circuit, an adjustment code generating circuit, an operation circuit, a K-bit register set _G, a K-bit register set _CK, compensation code output register 1-compensation code output register M, delay code output register 1-delay code output register M, and a channel selecting circuit. The input port of the core control circuit is connected to a calibration-start signal; the first output port of the core control circuit is connected to the control input port of the channel selecting circuit, the second output port thereof is connected to the control input port of the operation circuit, the third output port thereof is connected to the control input port of the selecting code generating circuit, the forth output port thereof is connected to the control input port of the adjustment code generating circuit, the fifth output port thereof is connected to the control input port of the K-bit register set _CK, the sixth output port thereof is connected to the control input port of the K-bit register set _G, the seventh output port-the M+6th output port thereof generate M calibration control signals G_Ctrl 1-G_Ctrl M, and the M+7th output port-the (2*M+6)th output port thereof generate M calibration control signals CK_Ctrl 1-CK_Ctrl M; the data input port of the operation circuit receives the data sent by the K-bit register set _CK output port and the K-bit register set _G output port, and the K-bit error code is generated according to the control instruction of the core control circuit; the K-bit error code is simultaneously sent to the data input port of the compensation code output register 1-the compensation code output register M and the delay code output register 1-the delay code output register M; moreover, the control signal input ports of the compensation code output register 1-the compensation code output register M are respectively connected to the M calibration control signals G_Ctrl 1-G_Ctrl M, and the control signal input ports of the delay code output register 1-the delay code output register M are respectively connected to the M calibration control signals CK_Ctrl 1-CK_Ctrl M, see FIG. 15 for details. The output ports of the compensation code output register 1-the compensation code output register M are respectively connected to the first to the Mth data input ports of the channel selecting circuit, and the output ports of the delay code output register 1-the delay code output register M are respectively connected to the M+1th-the 2*Mth data input ports of the channel selecting circuit. The channel selecting circuit outputs a K-bit compensation code or a K-bit delay code according to the control instruction of the core control circuit; the selecting code generating circuit generates a K-bit selecting code according to the control instruction of the core control circuit; the adjustment code generating circuit generates a K-bit global adjustment code according to the control instruction of the core control circuit; the data input port of the K-bit register set _CK receives the K-bit quantization code _CK sent by the clock phase error quantization circuit, and transmits the data stored in the internal register thereof to the operation circuit according to the control instruction of the core control circuit; the data input port of the K-bit register set _G receives the K-bit quantization code _G sent by the gain error quantization circuit, and transmits the data stored in the internal register thereof to the operation circuit according to the control instruction of the core control circuit.

In the circuit shown in FIG. 15, when the calibration control signals G_Ctrl 1-M and CK_Ctrl 1-M are in the calibration mode, only one signal is valid at any time. When the gain mismatch error calibration on the N-bit analog-digital converter of M-channel is performed, the output of the compensation code output register corresponding to the N-bit analog-digital converter that performs the gain mismatch error calibration is turned on by the channel selecting circuit, and the output of the remaining compensation code output registers are turned off; when the clock phase mismatch error calibration on the N-bit analog-digital converter of M-channel is performed, the output of the delay code output register corresponding to the N-bit analog-digital converter that performs the clock phase mismatch error calibration is turned on by the channel selecting circuit, and the output of the remaining delay code output registers are turned off.

When a K-bit error code is generated with the binary successive approximation algorithm by the operation circuit, only one bit of the K-bit error code is changed for each operation; in the gain mismatch error calibration process of the Yth calibration reference voltage, the K-bit error code needs to be cyclically operated for K times to generate a K-bit compensation code X cali (K)_RY; in the gain mismatch error calibration process of the N-bit analog-digital converter circuit X, since the calibration reference voltage in Z needs to be calibrated, therefore, the K-bit error code needs to be cyclically operated for K*Z times to obtain the K-bit compensation code X cali_fin and remains unchanged; in the gain mismatch error calibration process of all the N-bit analog-digital converter circuits of M-channel, the K-bit error code needs to be cyclically operated for K*Z*M times to obtain M sets of the K-bit compensation code Xcali_fin and remains unchanged, thus, the gain mismatch error calibration process for the N-bit analog-digital converter of M-channel for the multi-channel high-precision ADC circuit with self-calibration of mismatch error is ended.

The control circuit generates a first set of K-bit delay code 1 cali (1) and a first set of K-bit selecting code _CK; the first set of K-bit selecting code _CK enters the clock phase error quantization circuit and generates a first reference clock CKinref (1), and the first set of K-bit delay code 1 cali (1) enters the clock phase error compensation circuit and reaches the first error clock output port CKout 1; the clock phase error quantization circuit obtains a phase error by comparing the CKout 1 with the first reference clock CKinref (1), and the first set of K-bit quantization code _CK can be obtained by the conversion and is output to the control circuit; the control circuit receives the first set of K-bit quantization code _CK and stores it in the internal K-bit register set _CK thereof; the control circuit generates a second set of K-bit delay code 1 cali (2) with the binary search method according to the first set of K-bit quantization code _CK.

Subsequently, the second set of K-bit delay code 1 cali (2) enters the clock phase error compensation circuit and obtains CKout 1 with phase delay update, the clock phase error quantization circuit obtains the second set of K-bit quantization codes _CK by comparing the phase updated CKout1 with the first reference clock CKinref (1); the control circuit generates a third set of K-bit delay codes 1 cali (3) with the binary search method according to the second set of K-bit quantization code _CK.

With sequential circulation, the clock phase error quantization circuit continues to generate the Lth set of K-bit quantization code _CK, and the control circuit generates a L+1th K-bit delay code 1 cali (L+1) with the binary search method. When the control circuit generates the Kth K-bit delay code 1 cali (K), the control circuit keeps the K-bit delay code 1 unchanged, and the error calibration of the N-bit analog-digital converter circuit 1 is ended.

Subsequently, the control circuit outputs the Xth calibration control signal CK_Ctrl X and the Xth set of K-bit selecting code to generate the Xth reference clock CKinref (X), and starts the phase mismatch error calibration of the N-bit analog-digital converter circuit X. The multi-channel high-precision ADC circuit with self-calibration of mismatch error adopts the same calibration process as the N-bit analog-digital converter circuit 1 to obtain the Kth set of K-bit delay code X and remains unchanged, and the phase mismatch error calibration of the N-bit analog-digital converter circuit X is ended. According to the same calibration method, when the control circuit outputs the Mth calibration control signal CK_Ctrl M to the delay circuit M, the Kth set of K-bit delay code M is obtained and remains unchanged, and after the phase mismatch error calibration of the N-bit analog-digital converter circuit M is ended, the control circuit will change the Ctrl_mode_CK signal, and the multi-channel high-precision ADC circuit with self-calibration of mismatch error will complete the phase mismatch error calibration of the N-bit analog-digital converter of M-channel.

Subsequently, the control circuit controls the gain error quantization circuit to enter the calibration mode through the Ctrl_mode_G signal, and simultaneously outputs the K-bit selecting code _G to the gain error quantization circuit, and the multi-channel high-precision ADC circuit with self-calibration of mismatch error starts to perform gain mismatch error calibration on the N-bit analog-digital converter of M-channel; the control circuit outputs the first calibration control signal G_Ctrl 1 to the gain error compensation circuit to start the gain mismatch error calibration of the N-bit analog-digital converter circuit 1. The control circuit then generates a first set of K-bit selecting code _G into the gain error quantization circuit and generates a first calibration reference voltage Vr_cal (1); the first calibration reference voltage Vr_cal (1) is used as an analog input signal of the N-bit analog-digital converter 1, which enables the N-bit analog-digital converter 1 to perform a normal analog-digital conversion, first, the gain mismatch error calibration at the first calibration reference voltage is performed; the control circuit continues to generate the first set of K-bit compensation code 1 cali (1), which enters the gain error compensation circuit and obtains the first channel reference voltage Vr1 as the reference voltage for reference of the N-bit analog-digital converter 1, and the N-bit analog-digital converter 1 is subjected to analog-digital conversion to obtain a first set of first output quantization code D1 (1); The gain error quantization circuit processes the first set of the first output quantization code D1 (1) to obtain a first set of K-bit quantization code _G and outputs the same to the control circuit; the control circuit receives the first set of K-bit quantization code _G and stores in the internal K-bit register set G thereof; the control circuit generates a second set of K-bit compensation code 1 cali (2) with the binary search method according to the first set of K-bit quantization code _G.

Subsequently, the second set of K-bit compensation code 1 cali (2) enters the reference voltage adjusting circuit 1 and obtains the reference voltage updated Vr1, and the N-bit analog-digital converter 1 obtains a second set of the first output quantization code D1 (2) through the analog-digital conversion; the gain error quantization circuit processes the updated second set of the first output quantization code D1 (2) to obtain a second set of K-bit quantization code _G and outputs the same to the control circuit; the control circuit generates a third set of K-bit compensation code 1 cali (3) with the binary search method according to the second set of K-bit quantization code _G.

With sequential circulation, the gain error quantization circuit will continue to generate the Lth K-bit quantization code _G, and the control circuit will generate the L+1th K-bit compensation code 1 cali (L+1) with the binary search method. When the control circuit generates the Kth K-bit compensation code 1 cali (K), the control circuit stores the Kth K-bit compensation code 1 cali (K) into the new register and assigns it the K-bit compensation code 1 cali (K)_R1, and the gain mismatch error calibration at the first calibration reference voltage is ended.

The control circuit then generates a Yth set of K-bit selecting code _G; the Yth set of K bit selecting code _G enters the gain error quantization circuit and generates a Yth calibration reference voltage Vr_cal (Y); the Yth calibration reference voltage Vr_cal (Y) is used as an analog input signal of the N-bit analog-digital converter 1 to perform gain mismatch error calibration at the Yth calibration reference voltage; the high-precision gain mismatch error calibration circuit for multi-channel ADC will obtain the K-bit compensation code 1 cali (K)_RY in the same way as the gain mismatch error calibration at the first calibration reference voltage, and the gain mismatch error calibration at the Yth calibration reference voltage is ended. With sequential circulation, when the high-precision gain mismatch error calibration circuit for the multi-channel ADC obtains the last set of K-bit compensation code 1 cali (K)_RZ, and after the gain mismatch error calibration at the Zth calibration reference voltage is ended, the algorithm circuit in the control circuit will perform operation on the obtained Z sets of K-bit compensation code 1 cali (K)_R1-cali (K)_RZ, to obtain the final K-bit compensation code 1 cali_fin and keep it unchanged, and the gain mismatch error calibration of the N-bit analog-digital converter circuit 1 of the high-precision gain mismatch error calibration circuit for the multi-channel ADC is ended.

Subsequently, the control circuit outputs the Xth calibration control signal G_Ctrl X to the gain error compensation circuit to start the gain mismatch error calibration of the N-bit analog-digital converter circuit X. The high-precision gain mismatch error calibration circuit for multi-channel ADC obtains the K-bit compensation code X cali_fin in the same way as the gain mismatch error calibration at the N-bit analog-digital converter circuit 1, and the gain mismatch error calibration of the N-bit analog-digital converter circuit X is ended. According to the same calibration method, when the control circuit outputs the Mth calibration control signal G_Ctrl M to the gain error compensation circuit, the K-bit compensation code M cali_fin is obtained and remains unchanged, and after the gain mismatch error calibration of the N-bit analog-digital converter circuit M is ended, the control circuit will change the Ctrl_mode_G signal, and the multi-channel high-precision ADC circuit with self-calibration of mismatch error will complete the gain mismatch error calibration of the N-bit analog-digital converter of M-channel; the calibration mode for the high-precision gain mismatch error calibration circuit for the multi-channel ADC is ended.

In the description above, N and M are any positive integers; K is a positive integer not greater than N; X is a positive integer not greater than M; L is a positive integer not greater than K; Z is a positive integer not greater than $2^K-1$; Y is a positive integer not greater than Z.

The description above is only a description of the preferred embodiments of the invention, and is not intended to limit the scope of the invention. Any changes and modifications made by those skilled in the art in light of the disclosure above shall all fall within the protection scope of the appended claims.

The invention claimed is:

1. A multi-channel high-precision ADC circuit with self-calibration of mismatch error, comprising a gain error compensation circuit, a clock phase error compensation circuit, an N-bit analog-digital converter of M-channel, a gain error quantization circuit, a clock phase error quantization circuit and a control circuit; the N-bit analog-digital converter of M-channel comprises an N-bit analog-digital converter 1, an N-bit analog-digital converter 2, . . . , an N-bit analog-digital converter M; wherein the M reference voltage output ports Vrc 1, Vrc 2, . . . , Vrc M of the gain error compensation circuit are respectively connected to the reference voltage input port of the N-bit analog-digital converter 1, N-bit analog-digital converter 2, . . . , N-bit analog-digital converter M, and the M+1th reference voltage output port Vrinref of the gain error compensation circuit is connected to the reference voltage input port of the gain error quantization circuit; the M clock output ports CKc 1, CKc 2, . . . , CKc M of the clock phase error compensation circuit are respectively connected to the clock input port of the N-bit analog-digital converter 1, N-bit analog-digital converter 2, . . . , N-bit analog-digital converter M; the digital quantization code output ports D 1, D 2, . . . , D M of the N-bit analog-digital converter 1, N-bit analog-digital converter 2, . . . , N-bit analog-digital converter M are respectively connected to the M digital quantization code input ports of the gain error quantization circuit, the calibration reference signal Vr_cal of the gain error quantization circuit is output to the analog signal input port of the N-bit analog-digital converter 1, N-bit analog-digital converter 2, . . . , N-bit analog-digital converter M, and the K-bit quantization code _G of the gain error quantization circuit is output to the K-bit quantization code _G input port of the control circuit; the M+1 error clock output ports CKout 1, CKout 2, . . . , CKout M and CKinref of the clock phase error compensation circuit are connected to the M+1 clock input ports of the clock phase error quantization circuit, the K-bit quantization code _CK of the clock phase error quantization circuit is output to the K-bit quantization code _CK input port of the control circuit; the M K-bit delay code output ports of the control circuit are respectively connected to the M K-bit delay code input ports of the clock phase error compensation circuit, the M CK_Ctrl control signal output ports of the control circuit are respectively connected to M CK_Ctrl control signal input ports of the clock phase error compensation circuit, and the K-bit selecting code _CK output port and the Ctrl_mode_CK output port of the control circuit are respectively connected to the K-bit selecting code _CK input port and the Ctrl_mode_CK input port of the clock phase error quantization circuit; the M K-bit compensation code output ports of the control circuit are respectively connected to the M K-bit compensation code input ports of the gain error compensation circuit, and the M G_Ctrl control signal output ports of the control circuit are respectively connected to the M G_Ctrl control signal input ports of the gain error compensation circuit; the K-bit global adjustment code output port of the control circuit is connected to the K-bit global adjustment code input port of the gain error compensation circuit, and the K-bit selecting code _G output port and the Ctrl_mode_G output port of the control circuit are respectively connected to the K-bit selecting code _G input port and the Ctrl_mode_G input port of the gain error quantization circuit; N, M and K are arbitrary positive integers.

2. The multi-channel high-precision ADC circuit with self-calibration of mismatch error according to claim 1, wherein the multi-channel high-precision ADC circuit with self-calibration of mismatch error includes a calibration mode and a compensation mode, and the compensation mode is entered after the calibration mode is ended; when the calibration mode is entered, the phase mismatch error calibration on the N-bit analog-digital converters of M-channel are firstly sequentially performed by the multi-channel high-precision ADC circuit with self-calibration of mismatch error, to generate M sets of K-bit delay codes; after the phase mismatch error calibration is completed, the gain mismatch error calibration on the N-bit analog-digital converters of M-channel are then sequentially performed by the multi-channel high-precision ADC circuit with self-calibration of mismatch error, to generate M sets of K-bit compensation codes; when the compensation mode is entered, M sets of K-bit delay codes and M sets of K-bit compensation codes remain unchanged; the phase and gain mismatch error compensation for the N-bit digital-analog converter of M-channel are simultaneously performed by the multi-channel high-precision ADC circuit with self-calibration of mismatch error, and the gain error quantization circuit and the clock phase error quantization circuit are both turned off to reduce power consumption.

3. The multi-channel high-precision ADC circuit with self-calibration of mismatch error according to claim 1, wherein the clock phase error compensation circuit comprises: a clock receiving circuit, a clock duty-stabilizing circuit, a clock driving circuit, M delay circuits, M multi-phase clock generating circuits and M clock equivalent delay circuits; each delay circuit, each multi-phase clock generating circuit, and each clock equivalent delay circuit correspond one by one; the clock receiving circuit, the clock duty-stabilizing circuit, and the clock driving circuit are sequentially connected, and the input clock passes through the clock receiving circuit and enters the input port of the clock driving circuit; the M output clocks CKin 1, CKin 2, . . . , CKin M of the clock driving circuit are respectively output to the input ports of the M delay circuits, and the M+1th output clock CKinref of the clock driving circuit is output to the clock phase error quantization circuit; the control signal input ports of the M delay circuits are respectively connected to the M CK_Ctrl control signal output ports of the control circuit, the delay code input ports of the respective delay circuits are respectively connected to the M K-bit delay code output ports of the control circuit, and the clock output ports of the respective delay circuits are simultaneously connected to the clock input ports of the corresponding multi-phase clock generating circuit and the clock equivalent delay circuit; the multi-phase output clocks CKc 1, CKc 2, . . . , CKc M of the respective multi-phase clock generating circuits respectively enter the N-bit analog-digital converter of M-channel; the clock output ports CKout 1, CKout 2, . . . , CKout M of the respective clock equivalent delay circuits are respectively connected to the M clock input ports of the clock phase error quantization circuit.

4. The multi-channel high-precision ADC circuit with self-calibration of mismatch error according to claim 3, wherein the clock equivalent delay circuit comprises: a multi-phase clock circuit equivalent delay unit, a sample hold circuit equivalent delay unit, a multi-sub-stage circuit equivalent delay unit, and a digital calibration circuit equivalent delay unit; the multi-sub-stage circuit equivalent delay unit comprises a first sub-stage circuit equivalent delay unit, a second sub-stage circuit equivalent delay unit, . . . , an Rth sub-stage circuit equivalent delay unit; the multi-phase clock circuit equivalent delay unit, the sample hold circuit equivalent delay unit, the first sub-stage circuit equivalent delay unit, the second sub-stage circuit equivalent delay unit, . . . , the Rth sub-stage circuit equivalent delay unit and the digital calibration circuit equivalent delay unit are sequentially connected; the clock output port of the delay circuit is connected to the clock input port of the corresponding multi-phase clock circuit equivalent delay unit, and sequentially passes through the multi-phase clock circuit equivalent delay unit, the sample hold circuit equivalent delay unit, the first sub-stage circuit equivalent delay unit, the second sub-stage circuit equivalent delay unit, . . . , the Rth sub-stage circuit equivalent delay unit, and the digital calibration circuit equivalent delay unit, then the clock is output; when the clock equivalent delay circuit enters the calibration mode, the multi-phase clock circuit equivalent delay unit, the sample hold circuit equivalent delay unit, the multi-sub-stage circuit equivalent delay unit and the digital calibration circuit equivalent delay unit operate normally; when the clock equivalent delay circuit enters the compensation mode, the multi-phase clock circuit equivalent delay unit, the sample hold circuit equivalent delay unit, the multi-sub-stage circuit equivalent delay unit and the digital calibration circuit equivalent delay unit are turned off; R is a positive integer.

5. The multi-channel high-precision ADC circuit with self-calibration of mismatch error according to claim 1, wherein the clock phase error quantization circuit comprises: a reference clock generating circuit, a phase detector, a loop filter, and a K-bit analog-digital converter circuit; the M+1 clock input ports of the phase detector are respectively connected to the M clock output ports CKout 1, CKout 2, . . . , CKout M and the clock output port CKref of the reference clock generating circuit; the control input port of the reference clock generating circuit is connected to the K-bit selecting code _CK output port of the control circuit; the phase error signal output port Vp of the phase detector is connected to the input port of the loop filter; the output voltage Vi of the loop filter is input to the voltage input port of the K-bit analog-digital converter; the K-bit quantization code _CK generated by the K-bit analog-digital converter is output to the K-bit quantization code _CK input port of the control circuit; the calibration control signal Ctrl_mode_CK output port of the control circuit is simultaneously connected to the calibration control signal input port of the phase detector, the loop filter and the K-bit analog-digital converter.

6. The multi-channel high-precision ADC circuit with self-calibration of mismatch error according to claim 1, wherein the gain error compensation circuit comprises: a reference voltage generating circuit, a reference voltage remote driving circuit, and M reference voltage adjusting circuits; the reference voltage generating circuit outputs a reference voltage to the reference voltage remote driving circuit; the M reference voltage output ports of the reference voltage remote driving circuit are respectively connected to the reference voltage input ports of the M reference voltage adjusting circuits, and the M+1th reference voltage output port Vrinref is connected to the reference voltage input port of the gain error quantization circuit; the control signal input ports of the respective reference voltage adjusting circuits are respectively connected to the M G_Ctrl control signal output ports of the control circuit, the compensation code input ports of the respective reference voltage adjusting circuits are respectively connected to the M K-bit compensation code output ports of the control circuit, and the reference voltage output ports Vrc 1, Vrc 2, . . . , Vrc M of the respective reference voltage adjusting circuits are respectively output to the N-bit analog-digital converter of M-channel.

7. The multi-channel high-precision ADC circuit with self-calibration of mismatch error according to claim 1, wherein the gain error quantization circuit comprises a calibration reference signal generating circuit and an N-bit digital subtraction circuit; the digital quantization code output ports D 1, D 2, . . . , D M of the N-bit analog-digital converter of M-channel are respectively connected to the M sets of the digital code input ports of the N-bit digital subtraction circuit, and the M+1th set of the digital code input port of the N-bit digital subtraction circuit is connected to the output quantization code output port Dref of the calibration reference signal generating circuit; the control input port of the calibration reference signal generating circuit is connected to the K-bit selecting code _G output port of the control circuit; the K-bit quantization code _G output port of the N-bit digital subtraction circuit is connected to the K-bit quantization code _G input port of the control circuit; the calibration control signal Ctrl_mode_G output port of the control circuit is connected to the calibration control signal input port of the N-bit digital subtraction circuit and the calibration reference signal generating circuit.

8. The multi-channel high-precision ADC circuit with self-calibration of mismatch error according to claim 1, wherein the control circuit comprises: a core control circuit, a selecting code generating circuit, an adjustment code generating circuit, an operation circuit, a K-bit register set _G, a K-bit register set _CK, compensation code output register 1-compensation code output register M, delay code output register 1-delay code output register M, and a channel selecting circuit; the input port of the core control circuit is connected to a calibration-start signal; the first output port of the core control circuit is connected to the control input port of the channel selecting circuit, the second output port thereof is connected to the control input port of the operation circuit, the third output port thereof is connected to the control input port of the selecting code generating circuit, the forth output port thereof is connected to the control input port of the adjustment code generating circuit, the fifth output port thereof is connected to the control input port of the K-bit register set _CK, the sixth output port thereof is connected to the control input port of the K-bit register set _G, the seventh output port-the M+6th output port thereof generate M calibration control signals G_Ctrl 1-G_Ctrl M, and the M+7th output port-the (2*M+6)th output port thereof generate M calibration control signals CK_Ctrl 1-CK_Ctrl M; the data input port of the operation circuit receives the data sent by the K-bit register set _CK output port and the K-bit register set _G output port, and the K-bit error code is generated according to the control instruction of the core control circuit; the K-bit error code is simultaneously sent to the data input port of the compensation code output register 1-the compensation code output register M and the delay code output register 1-the delay code output register M; the control signal input ports of the compensation code output register 1-the compensation code output register M are respectively connected to the M calibration control signals G_Ctrl 1-G_Ctrl M, and the control signal input ports of the delay code output register 1-the delay code output register M are respectively connected to the M calibration control signals CK_Ctrl 1-CK_Ctrl M; the output ports of the compensation code output register 1-the compensation code output register M are respectively connected to the first-the Mth data input ports of the channel selecting circuit, and the output ports of the delay code output register 1-the delay code output register M are respectively connected to the M+1th to the 2*Mth data input ports of the channel selecting circuit; the channel selecting circuit outputs a K-bit compensation code or a K-bit delay code according to the control instruction of the core control circuit; the selecting code generating circuit generates a K-bit selecting code according to the control instruction of the core control circuit; the adjustment code generating circuit generates a K-bit global adjustment code according to the control instruction of the core control circuit; the data input port of the K-bit register set _CK receives the K-bit quantization code _CK sent by the clock phase error quantization circuit, and transmits the data stored in the internal register thereof to the operation circuit according to the control instruction of the core control circuit; the data input port of the K-bit register set _G receives the K-bit quantization code _G sent by the gain error quantization circuit, and transmits the data stored in the internal register thereof to the operation circuit according to the control instruction of the core control circuit.

9. The multi-channel high-precision ADC circuit with self-calibration of mismatch error according to claim 8, wherein when the gain mismatch error calibration on the N-bit analog-digital converter of M-channel is performed, the output of the compensation code output register corresponding to the N-bit analog-digital converter that performs the gain mismatch error calibration is turned on by the channel selecting circuit, and the output of the remaining compensation code output registers are turned off; when the clock phase mismatch error calibration on the N-bit analog-digital converter of M-channel is performed, the output of the delay code output register corresponding to the N-bit analog-digital converter that performs the clock phase mismatch error calibration is turned on by the channel selecting circuit, and the output of the remaining delay code output registers are turned off.

10. The multi-channel high-precision ADC circuit with self-calibration of mismatch error according to claim 8, wherein when a K-bit error code is generated with the binary successive approximation algorithm by the operation circuit, only one bit of the K-bit error code is changed for each operation.

\* \* \* \* \*